(12) United States Patent
Nam et al.

(10) Patent No.: US 7,012,259 B2
(45) Date of Patent: Mar. 14, 2006

(54) TFT STRUCTURE FOR HIGH RESOLUTION DIGITAL X-RAY DETECTOR

(76) Inventors: Sang-Hee Nam, 101-402 Yoowon Apt., Sajik-dong Dongnae-gu Busan (KR) 607-120; Jae-Hyung Kim, 104-202 LG Apt., Jwa-dong Haeundae-gu Busan (KR) 612-768; Chi-Woong Mun, 107-302 Yurim Asiad Apt., 285-4, Yangjeong-dong Busanjin-gu Busan (KR) 614-855; Hyung-won Lee, 3-901 Han Il Apt., 691-2, Sambang-dong Gimhae-si Gyeongsangnam-do (KR) 621-911; Sang-Ho Ahn, 103-1402 Daewoo Yutopia Apt., Eobang-dong Gimhae-si Gyeongsangnam-do (KR) 621-752; Jung-Gi Im, 24-506 Hangang Mansion Dongbu, Ichon-dong Yongsan-gu Seoul (KR) 140-724

( * ) Notice: Subject to any disclaimer, the term of this patent is extended or adjusted under 35 U.S.C. 154(b) by 170 days.

(21) Appl. No.: 10/486,559

(22) PCT Filed: Dec. 18, 2002

(86) PCT No.: PCT/KR02/02392

§ 371 (c)(1),
(2), (4) Date: Feb. 10, 2004

(87) PCT Pub. No.: WO2004/010210

PCT Pub. Date: Jan. 29, 2004

(65) Prior Publication Data

US 2004/0200970 A1    Oct. 14, 2004

(30) Foreign Application Priority Data

Jul. 22, 2002  (KR) .................. 10-2002-0042988

(51) Int. Cl.
*G01T 1/24*  (2006.01)

(52) U.S. Cl. .............. 250/370.09; 250/370.14; 250/338.4; 250/339.02

(58) Field of Classification Search ........... 250/370.09, 250/370.08, 370.14, 338.1, 339.02, 208.1
See application file for complete search history.

(56) References Cited

U.S. PATENT DOCUMENTS

| 4,772,885 | A | * | 9/1988 | Uehara et al. ................. 349/71 |
| 5,313,055 | A | * | 5/1994 | Shiratsuki et al. ........ 250/208.1 |
| 5,731,858 | A | * | 3/1998 | Hisatake et al. ............ 349/112 |
| 6,262,408 | B1 | * | 7/2001 | Izumi et al. ............. 250/208.1 |
| 6,330,303 | B1 | * | 12/2001 | Yamane et al. ............ 378/98.8 |
| 6,340,818 | B1 | * | 1/2002 | Izumi et al. ........... 250/370.13 |
| 2005/0195353 | A1 | * | 9/2005 | Park et al. ................. 349/139 |

FOREIGN PATENT DOCUMENTS

| JP | 03-158822 A | 7/1991 |
| JP | 2000-046951 A | 2/2000 |
| JP | 2002-168955 A | 6/2002 |

* cited by examiner

*Primary Examiner*—David Porta
*Assistant Examiner*—Faye Polyzos
(74) *Attorney, Agent, or Firm*—Birch, Stewart, Kolasch & Birch, LLP

(57) ABSTRACT

A structure of a TFT substrate for a high resolution digital x-ray detector, in which two TFT substrates are arranged to be a double substrate by overlapping each other such that an upper plate is moved ½ pixel distance with respect to a lower plate in a direction along one axis. Thus, a difference in movement between the upper and lower plates is a ½ pixel distance. Also, two virtual pixels are obtained from one pixel. Three TFT substrates are arranged to be a triple substrate by overlapping one another such that a middle plate is moved a ½ pixel distance with respect to a lower plate in a direction along an X axis and an uppermost plate is arranged by being moved a ½ pixel distance with respect to the lower plate in a direction along a Y axis. Thus, resolution is increased as data of one pixel is divided into four data to be analyzed and an measured value of a pixel of each overlapping substrate is compared.

3 Claims, 5 Drawing Sheets

TFT STRUCTURE FOR HIGH RESOLUTION DIGITAL X-RAY DETECTOR

TECHNICAL FIELD

The present invention relates to a TFT substrate for detecting an X-ray, and more particularly, to a structure of a TFT substrate for a high resolution digital X-ray detector in which two TFT substrates are arranged so that an upper substrate overlaps a lower substrate by moving a ½ pixel distance in one axial direction and measured values of pixels of the respective substrates overlapping each other are compared so that two data are obtained from one pixel and resolution is doubled.

BACKGROUND ART

In general, a TFT substrate for detecting an X-ray is a panel for converting image information of a radioactive ray to an electric signal and detecting the converted electric signal in a radioactive ray detecting apparatus for obtaining image information by detecting a radioactive ray penetrating a human body.

In the conventional technology method, a TFT substrate is a flat panel that is a set of cells using a pixel as a basic unit. A detecting apparatus using the TFT substrate generates a digital image by controlling a gate of each pixel arranged by column and detecting an electric signal through a data line of each pixel arranged by row so as to apply an electric image signal corresponding to each pixel to a display device such as a monitor.

Thus, the image resolving power of a conventional TFT substrate, accurately, a TFT active matrix panel, strongly depends on a pixel pitch of a TFT panel. That is, the image resolving power of a TFT substrate is dependent on the pixel size of the TFT substrate.

However, the pixel size of the TFT substrate is determined by the present semiconductor manufacturing technology. According to the present semiconductor manufacturing technology, the size of a pixel of a TFT substrate is not more than tens of micrometers due to a technical limit in manufacturing a fine pixel. Therefore, with the TFT substrate, it is impossible to provide a high resolution image provided by an image device such as a CCD and CMOS.

DISCLOSURE OF INVENTION

To solve the above and other problems, the present invention provides the structure of a TFT substrate for a high resolution digital X-ray detector by which a limit in resolution due to the conventional manufacturing process of a TFT pixel is overcome.

The present invention provides the structure of a TFT substrate for a high resolution digital X-ray detector in which resolution is increased by forming a plurality of virtual pixels in the area of one TFT pixel.

According to an aspect of the present invention, a structure of a TFT substrate for a high resolution digital X-ray detector, wherein two TFT substrates are arranged to be a double substrate by overlapping each other such that an upper plate is moved a ½ pixel distance with respect to a lower plate in a direction along one axis, so that a difference in movement between the upper and lower plates is a ½ pixel distance and two virtual pixels are obtained from one pixel.

In the double substrate, when pixel rows of the upper plate and the lower plate are A and B, respectively, and a virtual pixel row formed by the movement of the upper plate in a direction of the ½ pixel distance is I, and assuming that $A_t$ is an measured value of the $t^{th}$ pixel of the plate A;

$B_t$ is an measured value of the $t^{th}$ pixel of the plate B which is obtained by correcting an attenuation error occurring due to the thickness of the plate A; and $I_t$ is a value of the $t^{th}$ pixel of the plate I, and that $$\sum_{x}^{N} A$$

is a sum of measured values from the $x^{th}$ pixel to the $N^{th}$ pixel in the pixel row of the plate A and $$\sum_{x}^{N} B$$

is a sum of measured values from the $x^{th}$ pixel to the $N^{th}$ pixel in the pixel row of the plate B, $I_t$ of the virtual pixel row is obtained from the following equations:

$$I_{2k} = \sum_{k}^{N} A - \sum_{k}^{N} B$$

wherein k=0, 1, 2, 3, . . . N when t is an even number (2k); and $$I_{2k+1} = \sum_{k}^{N} B - \sum_{k+1}^{N} A$$

wherein k=0, 1, 2, 3, . . . N when t is an odd number (2k+1).

According to another aspect of the present invention, a structure of a TFT substrate for a high resolution digital X-ray detector, wherein three TFT substrates are arranged to be a triple substrate by overlapping one another such that a middle plate is moved a ½ pixel distance with respect to a lower plate in a direction along an X axis and an uppermost plate is arranged by being moved a ½ pixel distance with respect to the lower plate in a direction along a Y axis, so that resolution is increased as data of one pixel is divided into four data to be analyzed and an measured value of a pixel of each overlapping substrate is compared.

BRIEF DESCRIPTION OF THE DRAWINGS

The above and other features and advantages of the present invention will become more apparent by describing in detail preferred embodiments thereof with reference to the attached drawings in which.

BEST MODE FOR CARRYING OUT THE INVENTION

Figure 1:
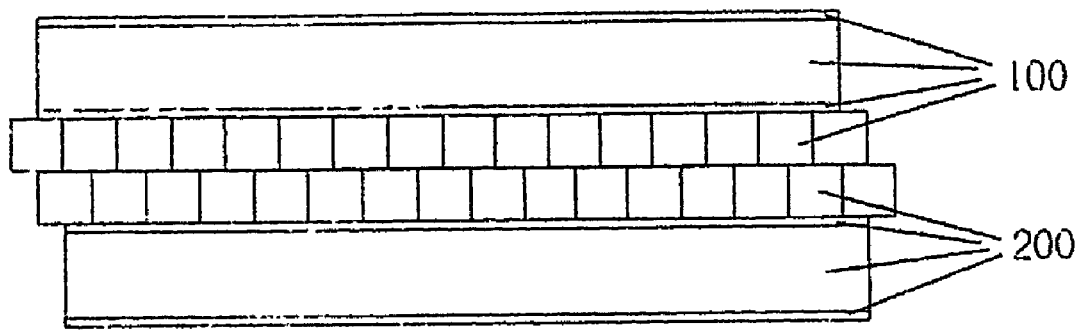
FIG. 1 is a view illustrating the overlap structure of a TFT substrate for a high resolution digital X-ray detector according to a preferred embodiment of the present invention.

As shown in the drawings, the present invention concerns a stacked substrate by overlapping conventional TFT substrates so that resolution is increased as many as the number of stacked substrates.

In detail, when TFT substrates for detecting an X-ray are arranged overlapping each other, an upper substrate overlaps a lower substrate by moving a ½ pixel distance in one axial direction so that the movement difference between the upper and lower substrates has a ½ pixel distance.

The overlap is made as the respective substrates move in the same axial direction by a ½ pixel distance. A pixel of the original substrate is divided into two by the overlap so that two virtual pixels are formed which can be used as data process addresses. The value of the virtual pixel is obtained by comparing the measured value of the respective overlapping substrates using a data interpretation algorithm.

In the following description of the data interpretation algorithm, a preferred embodiment having two overlapping substrates is detailed for the easy explanation of the algorithm.

Two overlapping substrates, which is referred to as a double overlapping substrate, are overlapped as an upper plate 100 is moved by a ½ pixel distance with respect to a lower plate 200. Thus, a structure of a TFT substrate for a high resolution digital X-ray detector which doubles a resolution thereof is made.

For the explanation of the algorithm, when pixel rows of the upper plate 100 and the lower plate 200 of the double overlapping substrate are A and B, respectively, and a virtual pixel row formed by the movement of the upper plate 100 in a direction of the ½ pixel distance is I, and assuming that $A_t$ is an measured value of the $t^{th}$ pixel of the plate A;

$B_t$ is an measured value of the $t^{th}$ pixel of the plate B which is obtained by correcting an attenuation error occurring due to the thickness of the plate A; and $I_t$ is a value of the $t^{th}$ pixel of the plate I, and that $$\sum_{x}^{N} A$$

is a sum of measured values from the $x^{th}$ pixel to the $N^{th}$ pixel in the pixel row of the plate A and $$\sum_{x}^{N} B$$

is a sum of measured values from the $x^{th}$ pixel to the $N^{th}$ pixel in the pixel row of the plate B, $I_t$ of the virtual pixel row is obtained from the following equations.

$$I_{2k} = \sum_{k}^{N} A - \sum_{k}^{N} B$$

wherein k=0, 1, 2, 3, . . . N when t is an even number (2k)

$$I_{2k+1} = \sum_{k}^{N} B - \sum_{k+1}^{N} A$$

wherein k=0, 1, 2, 3, . . . N when t is an odd number (2k+1)

Figure 4:
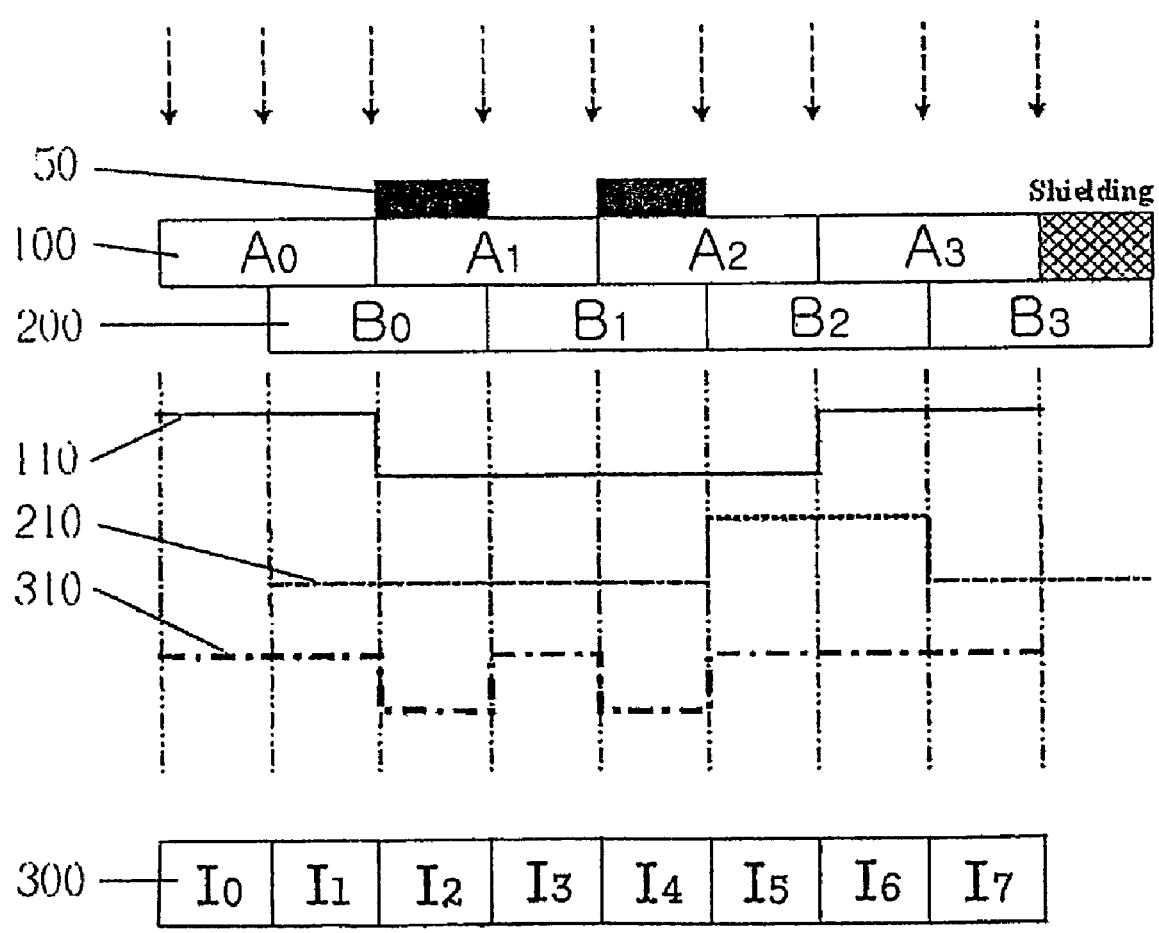
FIG. 4 is a view showing the value of a virtual pixel obtained by the structure of a TFT substrate for a high resolution digital X-ray detector according to a preferred embodiment of the present invention.

FIG. 4 shows that the value of the virtual pixel is obtained. In FIG. 4, different values are measured from a pixel of the upper and lower plates 100 and 200 with respect to the object to be pictured. The plate A of FIG. 4 is the upper plate 100 and the plate B is the lower plate 200. Plate I is a virtual substrate 300.

Each of substrates of FIG. 4 is presented as $A_k$ to be distinguished by unit of cell. (k is a cell address.) When a particular material 50 is placed on the substrate, each of the upper and lower plates 100 and 200 outputs a reaction amount by pixel.

In FIG. 4, assuming that the amount of irradiation of an X-ray is the same so that the amount of irradiation of an X-ray matches 1 per unit cell and that the material on the substrate completely cut the X-ray, when it is presented by Plate$_{address}$(reaction amount), $A_0(1)$, $A_1(0.5)$, $A_1(0.5)$, $A_2(1)$ and
$B_0(0.5)$, $B_1(0.5)$, $B_2(1)$, $B_3(0.5)$, wherein B is considered as a value that is attenuation corrected.

When the value of the virtual pixel I is obtained by the values of A and B, $I_0=\{A_0(1)+A_1(0.5)+A_2(0.5)+A_3(1)\}-\{B_0(0.5)+B_2(0.5)+B_2(1)+B_3(0.5)\}$.

That is, $I_0=\{1+0.5+0.5+1\}-\{0.5+0.5+1+0.5\}$ so that $I_0=\{3\}-\{2.5\}=0.5$.

When the value of each of I is obtained, $I_1=\{B_0(0.5)+B_1(0.5)+B_2(1)+B_3(0.5)\}-\{A_1(0.5)+A_2(0.5)+A_3(1)\}=0.5$ $I_2=\{A_1(0.5)+A_2(0.5)+A_3(1)\}-\{B_1(0.5)+B_2(1)+B_3(0.5)\}=0.5$ $I_3=\{B_1(0.5)+B_2(1)+B_3(0.5)\}-\{A_2(0.5)+A_3(1)\}=0.5$ $I_4=\{A_2(0.5)+A_3(1)\}-\{B_2(1)+B_3(0.5)\}=0$ $I_5=\{B_2(1)+B_3(0.5)\}-\{A_3(1)\}=0.5$ $I_6=\{A_3(1)\}-\{B_3(0.5)\}=0.5$ $I_7=\{B_3(0.5)\}=0.5$ Thus, it can be seen that, when each of the upper and lower plates 100 and 200 is made of four pixels, eight virtual pixel values 310 can be obtained.

When the value shown in FIG. 4 and the virtual pixel value 310 are compared with each other, it can be seen that the result of the comparison matches a value actually applied to the virtual pixel.

Thus, a substrate having double the resolution is provided by utilizing information about the virtual pixel as image information.

In the case of the above-described double overlapping substrate, when t of $I_t$ is an even number including 0, $$I_0 = \{A_1(1) + A_1(0.5) + A_2(0.5) + A_3(1)\} - \{B_0(0.5) + B_1(0.5) + B_2(1) + B_3(0.5)\};$$

$$I_2 = \{A_1(0.5) + A_2(0.5) + A_3(1)\} - \{B_1(0.5) + B_2(1) + B_3(0.5)\} = 0$$

$$I_4 = \{A_2(0.5) + A_3(1)\} - \{B_2(1) + B_3(0.5)\} = 0; \text{ and}$$

$$I_6 = \{A_3(1)\} - \{B_3(0.5)\} = 0.5.$$

Thus, when k=0, 1, 2, 3, ... N, $$I_{2k} = \sum_{k}^{N} A - \sum_{k}^{N} B,$$

wherein t of $I_t$ is an even number (2k).

When t of $I_t$ is an odd number, $$I_1 = \{B_0(0.5) + B_1(0.5) + B_2(1) + B_3(0.5)\} - \{A_1(0.5) + A_2(0.5) + A_3(1)\} = 0.5;$$

$$I_3 = \{B_1(0.5) + B_2(1) + B_3(0.5)\} - \{A_2(0.5) + A_3(1)\} = 0.5;$$

$$I_5 = \{B_2(1) + B_3(0.5)\} - \{A_3(1)\} = 0.5; \text{ and}$$

$$I_7 = \{B_3(0.5)\} = 0.5.$$

Thus, when k=0, 1, 2, 3, ... N, $$I_{2k+1} = \sum_{k}^{N} B - \sum_{k+1}^{N} A,$$

wherein t of $I_t$ is an odd number (2k+1).

Figure 2:
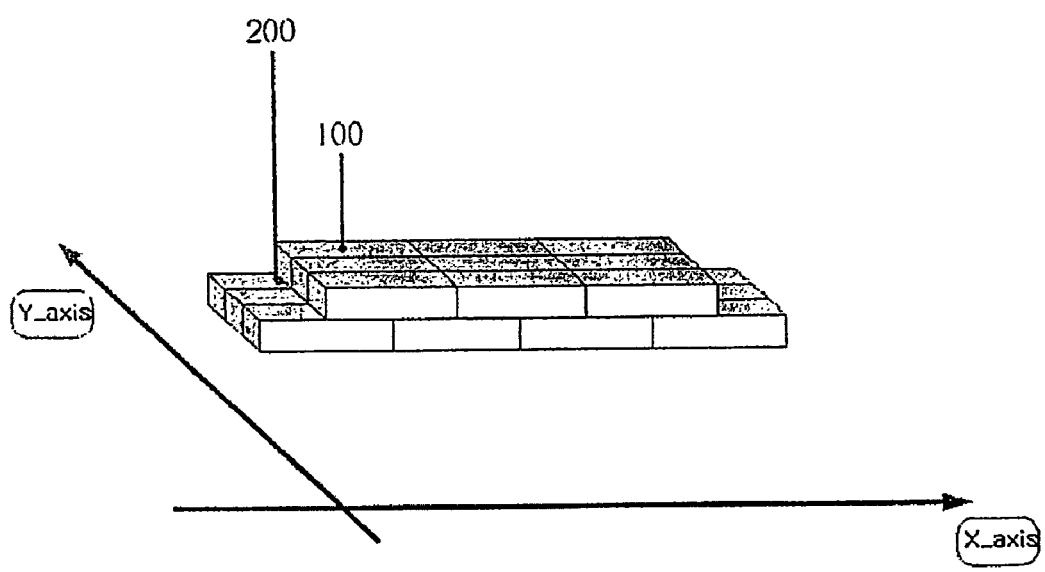
FIG. 2 is a view illustrating the structure of a TFT substrate for a high resolution digital X-ray detector according to a preferred embodiment of the present invention.

In the meantime, as shown in FIG. 2, since the plate B corresponding to the lower plate 200 is attenuated as it passes the thickness of the plate A that is the upper plate 100, a value of the attenuation should be corrected.

That is, since $B = e^{-\mu d} A$ wherein $\mu$ is a linear attenuation coefficient and d is a thickness of an absorption body (the plate B), the same value as that of the upper plate 100 should be measured in the lower plate 200 by correcting the attenuation value.

For reference, the calculation of data considering the attenuation is described below.

$$C(A_0) = I_0(1 - e^{-\mu d}) + I_1(1 - e^{-\mu d})$$
$$= \alpha(I_0 + I_1)(1 - e^{-\mu d})$$

$$C(A_1) = \alpha(I_2 + I_3)(1 - e^{-\mu d})$$

$$C(A_2) = \alpha(I_4 + I_5)(1 - e^{-\mu d})$$

$$C(B_0) = \alpha[I_1 e^{-\mu d}(1 - e^{-\mu d}) + I_2 e^{-\mu d}(1 - e^{-\mu d})]$$
$$= \alpha(I_1 + I_2) e^{-\mu d}(1 - e^{-\mu d})$$

$$C(B_1) = \alpha(I_3 + I_4) e^{-\mu d}(1 - e^{-\mu d})$$

$$C(B_2) = \alpha(I_5 + I_6) e^{-\mu d}(1 - e^{-\mu d})$$

$$I_0 + I_1 = \alpha^{-1}(1 - e^{-\mu d})^{-1} C(A_0) = \beta C(A_0)$$

$$I_2 + I_3 = \alpha^{-1}(1 - e^{-\mu d})^{-1} C(A_1) = \beta C(A_1)$$

$$I_4 + I_5 = \alpha^{-1}(1 - e^{-\mu d})^{-1} C(A_2) = \beta C(A_2)$$

$$\vdots$$

$$I_1 + I_2 = \alpha^{-1}(1 - e^{-\mu d})^{-1} e^{\mu d} C(B_0) = \beta e^{\mu d} C(B_0)$$

$$I_3 + I_4 = \alpha^{-1}(1 - e^{-\mu d})^{-1} e^{\mu d} C(B_1) = \beta e^{\mu d} C(B_1)$$

$$I_1 + I_2 = \alpha^{-1}(1 - e^{-\mu d})^{-1} e^{\mu d} C(B_2) = \beta e^{\mu d} C(B_2)$$

$$I_5 = \beta e^{\mu d} C(B_2)$$

$$I_4 = \beta C(A_2) - \beta e^{\mu d} C(B_2) = \beta(C(A_2) - e^{\mu d} C(B_2))$$

$$I_3 = \beta e^{\mu d} C(B_1) - \beta C(A_2) - e^{\mu d} C(B_2)$$
$$= \beta[e^{\mu d} C(B_1) - C(A_2) + e^{\mu d} C(B_2)]$$
$$= \beta[e^{\mu d}(C(B_1) + C(B_2)) - C(A_2)]$$

$$I_2 = \beta C(A_1) - \beta[e^{\mu d} C(B_1) + C(B_2)) - C(A_2)]$$
$$= \beta[C(A_1) + C(A_2) - e^{\mu d}(C(B_1) + C(B_2))]$$

$$I_1 = \beta e^{\mu d} C(B_0) - \beta[C(A_1) + C(A_2) - e^{\mu d}(C(B_1) + C(B_2))]$$
$$= \beta[e^{\mu d}(C(B_0) + C(B_1) + C(B_2)) - (C(A_1) + C(A_2))]$$

$$I_0 = \beta[(C(A_0) + C(A_1) + C(A_2)) - e^{\mu d}(C(B_0) + C(B_1) + C(B_2))]$$

Figure 5:
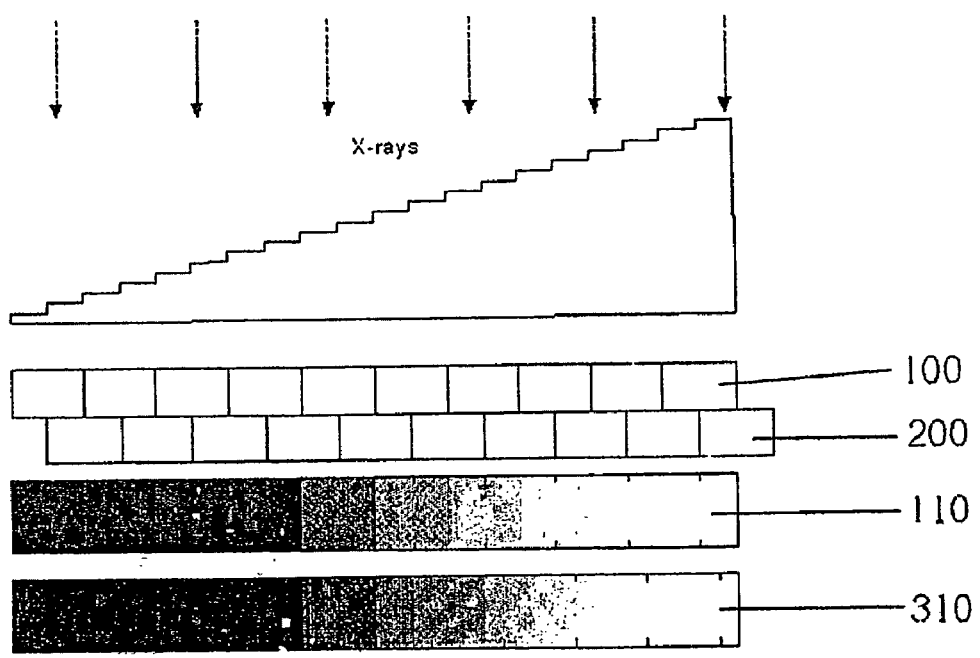
FIG. 5 is a view illustrating the structure of a TFT substrate for a high resolution digital X-ray detector according to yet another preferred embodiment of the present invention.

In the meantime, FIG. 5 shows a structure of a TFT substrate for a high resolution digital X-ray detector according to yet another preferred embodiment of the present invention. A change in resolution by the virtual pixel is expressed by a gray scale with steps.

That is, FIG. 5 is a view showing the comparison of a gray change of a reaction value 110 of the upper plate and a gray change of the reaction value 310 of the virtual plate 300, by using a step wedge filter having a scale of a virtual pixel size that is used to obtain a gray scale.

The gray change of the virtual pixel value 310 indicated by the gray scale with steps of FIG. 5 indicates a distinctive resolution change.

Since the gray scale is interpreted as a reference material in calculation of bone mineral density, the bone mineral density can be more accurately calculated according to the present invention.

The algorithm for obtaining data of a virtual pixel is described above. According to the present invention, the substrates are overlapped and a virtual pixel $I_k$ is obtained by an algorithm used to interpret data of the overlapping substrates and used as a source of an image signal, so that resolution can be increased.

Figure 3:
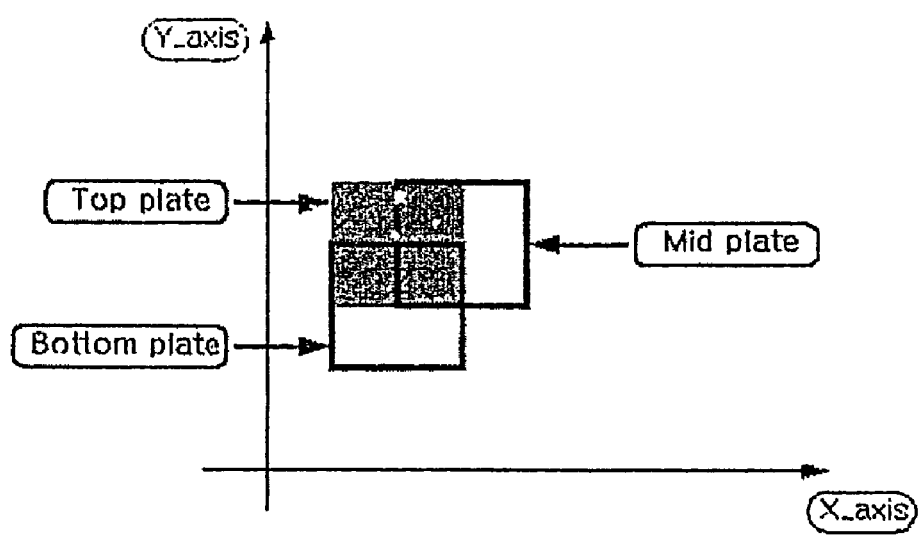
FIG. 3 is a view illustrating the structure of a TFT substrate for a high resolution digital X-ray detector according to another preferred embodiment of the present invention.

In the present invention, as shown in FIG. 3, by moving two substrates a ½ pixel distance in the x axis and the y axis to overlap each other, each virtual pixel divided by four can be obtained.

The virtual pixel data of a triple overlapping substrate can be obtained by independently performing twice the algorithm for obtaining the double pixel data.

INDUSTRIAL APPLICABILITY

As described above, according to the present invention, since a virtual pixel overlapping in a pixel area of a TFT substrate is obtained, a structure of a TFT substrate for a high resolution digital X-ray detector is provided.

Since resolution can be increased by using a conventional TFT substrate, the manufacturing cost can be remarkable lowered.

Also, the present invention can contribute to development of the field of a radioactive ray apparatus requiring a high resolution of a TFT substrate.

Further, since the grapy scale of an image is subdivided, the present invention can assist more accurate diagnosis in the field of a bone mineral density measurement.

What is claimed is:

1. A TFT structure for a high resolution digital X-ray detector, wherein two TFT substrates are arranged to be a double substrate by overlapping each other such that an upper plate is moved a ½ pixel distance with respect to a lower plate in a direction along one axis, so that a difference in movement between the upper and lower plates is a ½ pixel distance and two virtual pixels are obtained from one pixel.

2. The TFT structure of claim 1, wherein, in the double substrate, when pixel rows of the upper plate and the lower plate are A and B, respectively, and a virtual pixel row formed by the movement of the upper plate in a direction of the ½ pixel distance is I, and assuming that $A_t$ is an measured value of the $t^{th}$ pixel of the plate A;

$B_t$ is an measured value of the $t^{th}$ pixel of the plate B which is obtained by correcting an attenuation error occurring due to the thickness of the plate A; and $I_t$ is a value of the $t^{th}$ pixel of the plate I, and that $$\sum_{x}^{N} A$$

is a sum of measured values from the $x^{th}$ pixel to the $N^{th}$ pixel in the pixel row of the plate A and $$\sum_{x}^{N} B$$

is a sum of measured values from the $x^{th}$ pixel to the $N^{th}$ pixel in the pixel row of the plate B, $I_t$ of the virtual pixel row is obtained from the following equations:

$$I_{2k} = \sum_{k}^{N} A - \sum_{k}^{N} B$$

wherein k=0, 1, 2, 3, . . . N when t is an even number (2k); and $$I_{2k+1} = \sum_{k}^{N} B - \sum_{k+1}^{N} A$$

wherein k=0, 1, 2, 3, . . . N when t is an odd number (2k+1).

3. A TFT structure for a high resolution digital X-ray detector, wherein three TFT substrates are arranged to be a triple substrate by overlapping one another such that a middle plate is moved a ½ pixel distance with respect to a lower plate in a direction along an X axis and an uppermost plate is arranged by being moved a ½ pixel distance with respect to the lower plate in a direction along a Y axis, so that resolution is increased as data of one pixel is divided into four data to be analyzed and an measured value of a pixel of each overlapping substrate is compared.

* * * * *